United States Patent
Wu et al.

(10) Patent No.: US 8,612,186 B2
(45) Date of Patent: Dec. 17, 2013

(54) NUMERICAL SIMULATION OF STRUCTURAL BEHAVIORS USING A MESHFREE-ENRICHED FINITE ELEMENT METHOD

(75) Inventors: Cheng-Tang Wu, Livermore, CA (US);
Wei Hu, Livermore, CA (US)

(73) Assignee: Livermore Software Technology Corp., Livermore, CA (US)

( * ) Notice: Subject to any disclaimer, the term of this patent is extended or adjusted under 35 U.S.C. 154(b) by 519 days.

(21) Appl. No.: 13/038,330

(22) Filed: Mar. 1, 2011

(65) Prior Publication Data

US 2012/0226482 A1    Sep. 6, 2012

(51) Int. Cl.
*G06F 17/50* (2006.01)
*G06F 7/60* (2006.01)
*G06G 7/48* (2006.01)

(52) U.S. Cl.
USPC ............................ 703/2; 703/1; 703/6; 703/7

(58) Field of Classification Search
None
See application file for complete search history.

(56) References Cited

U.S. PATENT DOCUMENTS

| | | | |
|---|---|---|---|
| 6,718,291 B1 * | 4/2004 | Shapiro et al. | 703/2 |
| 7,499,050 B2 * | 3/2009 | Wu et al. | 345/420 |
| 7,660,480 B1 * | 2/2010 | Wu et al. | 382/264 |
| 7,702,490 B1 * | 4/2010 | Wu et al. | 703/2 |

* cited by examiner

*Primary Examiner* — Omar Fernandez Rivas
*Assistant Examiner* — Nithya J Moll
(74) *Attorney, Agent, or Firm* — Roger H. Chu

(57) ABSTRACT

System, method and software product for numerically simulating structural behaviors of an engineering product in compressible and near-incomprssible region is disclosed. Meshfree enriched finite element method (ME-FEM) is used for such numerical simulation. ME-FEM requires an engineering product be represented by a FEM model comprising a plurality of finite elements. Finite elements used in the ME-FEM are generally low-order finite elements. Each of the finite elements in the FEM model is enriched by at least one meshfree enriched (ME) node located within the element's domain. Each ME node has additional degrees-of-freedom for the element it belongs independent from those of the corner nodes. A displacement based first-order convex meshfree approximation is applied to the ME node. The convex meshfree approximation has Knonecker-delta property at the element's boundary. The gradient matrix of ME-FEM element satisfies integration constraint. ME-FEM interpolation is an element-wise meshfree interpolation that is discrete divergence-free at the incompressible limit.

12 Claims, 13 Drawing Sheets

$\overline{Q}_c$

○ Meshfree enriched node

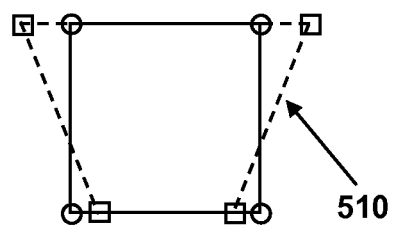 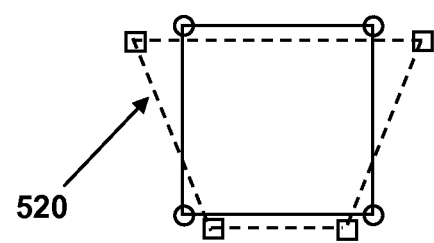
FIG. 5A  FIG. 5B

NUMERICAL SIMULATION OF STRUCTURAL BEHAVIORS USING A MESHFREE-ENRICHED FINITE ELEMENT METHOD

FIELD OF THE INVENTION

The present invention generally relates to computer-aided engineering (CAE) analysis of engineering products or components, more particularly to systems and methods for numerical simulation of structural behaviors using a meshfree-enriched finite element method (ME-FEM).

BACKGROUND OF THE INVENTION

Traditionally, FEM or Finite Element Analysis (FEA) is one of the most popular computer aided engineering tool for engineers and scientists to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

However, FEM in certain circumstances has its drawbacks. For instance, FEM may not be advantageous due to numerical compatibility condition is not the same as the physical compatibility condition of a continuum. In particular, in Lagrangian type of computations, one may experience mesh distortion, which can either end the computation altogether or result in dramatic deterioration of accuracy. In addition, the FEM often requires a very fine mesh in problems with high gradients or a distinct local character, which can be computationally expensive. In a procedure called Arbitrary Lagrangian Eulerian (ALE) formulations, its objective is to move the mesh independently of the material so that the mesh distortion can be minimized. But the distortion in general still creates several numerical errors for large strain and/or high speed impact simulations. Furthermore, a mesh may carry inherent bias in numerical simulations, and its presence becomes a nuisance in computations. An example is the strain localization problem, which is notorious for its mesh alignment sensitivity. Therefore it is computationally efficacious to discretize a continuum by a set of nodal points without mesh constraints.

As a result, in recent years, meshfree method has also been used to solve these drawbacks suffered in FEM. However, meshfree method suffers its own problems. For example, the computational costs are generally too high comparing to that of FEM. It is very difficult and computational expensive to impose essential boundary conditions in meshfree method.

Neither FEM nor meshfree method can numerically predict every possible structural behaviors under various environmental loads, for example, a numerical phenomenon called volumetric locking for simulating structural behaviors in compressible and/or near-incomprssible regions (e.g., rubber, material under large plastic deformation). FIG. 1A depicts a simplified two-dimensional example illustrating the volumetric locking effect. Element 102 is fixed in two of its four sides. As a result, node 112 is fixed in space thus not moving in numerical simulation. However, this does not represent a physical reality.

Volumetric locking can be described using a set of mathematical derivation as follows:

Consider a plane-homogeneous isotropic linear material body which occupies a bounded polygonal domain $\Omega$ in $\mathbb{R}^2$ with boundary $\Gamma = \partial \Omega$. The problem is restricted to small deformation and the infinitesimal strain tensor $\varepsilon$ is defined as a function of the displacement u by $$\varepsilon(u) = \frac{1}{2}(\nabla u + \nabla u^T) \quad (1)$$

For a prescribed body force f, the governing equilibrium equation in $\Omega$ reads $$\nabla \cdot \sigma + f = 0 \quad (2)$$

where $\sigma$ is the symmetric Cauchy stress tensor. With the fourth-order elasticity tensor denoted by C, the constitutive equation is given by $$\sigma = C\varepsilon = 2\mu\varepsilon + \lambda(tr\varepsilon)I \text{ in } \Omega \quad (3)$$

where I is the identity tensor of order four. Symbols $\mu$ and $\lambda$ are Lamé constants which are related to the Young's modulus E and Poisson ratio $v$ by $$\mu = \frac{E}{2(1+v)}, \lambda = \frac{vE}{(1+v)(1-2v)} \quad (4)$$

For simplicity, the displacement is assumed to satisfy the homogeneous Dirichlet boundary condition u=0 on $\Gamma_D$ and the traction t is distributed over the Neumann boundary $\Gamma_N$ with $\Gamma = \Gamma_D \cup \Gamma_N$ and $\Gamma_D \cup \Gamma_N = 0$. The variational form of this problem is to find the displacement $u \in V$ such that $$A(u,v) = l(v) \forall v \in V \quad (5)$$

where the space $V = H_0^1(\Omega)$ consists of functions in Sobolev space $H^1(\Omega)$ which vanish on the boundary and is defined by $$V(\Omega) = \{v : v \in H^1, v=0 \text{ on } \Gamma_D\} \quad (6)$$

The bilinear form $A(.,.)$ and linear functional $l(.)$ in Eq. (5) are defined by $$A: V \times V \to \quad A(u,v) = 2\mu \int_\Omega \varepsilon(u) : \varepsilon(v) \, d\Omega + \lambda \int_\Omega (\nabla \cdot u)(\nabla \cdot v) \, d\Omega \quad (7)$$

$$l: V \to \Box \quad l(v) = \int_\Omega f \cdot v \, d\Omega + \int_{\Gamma_N} t \cdot v \, d\Gamma \quad (8)$$

The bilinear form $A(.,.)$ in the above equation is symmetric, V-elliptic and continuous on V. By Korn's inequality and Lax-Milgram theorem, there exists a unique solution to the problem.

The standard Galerkin method is then formulated on a finite dimensional subspace $V^h \subset V$ employing the variational formulation of Eq. (5) to find $u^h \in V^h$ such that $$A(u^h, v^h) = l(v^h) \forall v^h \in V^h \qquad (9)$$

The second term on the right hand side (RHS) of Eq. (7) resembles the penalty term similar to the classical penalty method in the Stokes problems. For the energy in Eq. (7) to remain finite as $\lambda \to \infty$ (or $v \to 0.5$), the following constraint must be enforced $$\nabla \cdot u = 0 \text{ for } u \in V \qquad (10)$$

Similarly in the finite dimensional space, we have $$\nabla \cdot u^h = 0 \text{ for } u^h \in V^h \qquad (11)$$

The solution of Eq. (9) using a low-order approximation for displacement field in general does not satisfy the constraint in Eq. (11) and fails to converge uniformly as $v \to 0.5$. This is the volumetric locking in the near-incompressible problem. In other words, volumetric locking occurs when the approximation space $V^h$ is not rich enough for the approximation to verify the divergence-free condition $\nabla \cdot u^h = 0$. Shown in FIG. 1B are eight non-physical modes for 3×3 discretization using EFG—a prior art meshfree procedure.

An eigenvalue analysis using the left hand side (LHS) of Eq. (9) can be employed to further reveal the locking phenomena in the low-order displacement-based finite element and meshfree methods. The eigenvalue analysis of one rectangular quadrilateral bilinear (Q1) finite element with 2×2 Gauss integration points is analyzed first and two non-physical locking modes are obtained and shown in FIGS. 1C and 1D. The eigenvalues grow unbounded as v approaches to 0.5, which is not expected physically. Accordingly, eight non-physical locking modes are obtained from the eigenvalue analysis using four rectangular Q1 elements. Similar to the results in the four Q1 finite element model, the same number of non-physical locking modes are generated by Element-Free Galerkin (EFG) method as displayed in FIG. 1B using the first-order approximation with normalized nodal support equal to 1.5. The increase of nodal support and order of Gaussian quadrature rule does not completely eliminate the volumetric locking in EFG method. The number of non-physical modes remains unchanged.

Based on the aforementioned drawbacks, shortcomings and problems, it would, therefore, be desirable to have an improved computer-implemented method for numerically simulating structural behaviors in compressible and/or near-incompressible regions.

BRIEF SUMMARY OF THE INVENTION

This section is for the purpose of summarizing some aspects of the present invention and to briefly introduce some preferred embodiments. Simplifications or omissions in this section as well as the abstract and the title herein may be made to avoid obscuring the purpose of the section. Such simplifications or omissions are not intended to limit the scope of the present invention.

The present invention discloses a system, method and software product for numerically simulating structural behaviors of an engineering product in compressible and/or near-incomprssible region.

According to one aspect, meshfree enriched finite element method (ME-FEM) is used for such numerical simulation. ME-FEM requires an engineering product be represented by a FEM model comprising a plurality of finite elements (e.g., plate, solid, etc.). The finite elements used in the ME-FEM are generally low-order finite elements (i.e., finite elements having only corner nodes). Each of the finite elements in the FEM model is enriched by at least one added node referred to as meshfree node or meshfree enriched (ME) node located within the element's domain (i.e., within the outer boundary of the element).

According to another aspect, each ME node has additional degrees-of-freedom for the element it belongs independent from those of the corner nodes. A particular procedure referred to as displacement based first-order convex meshfree approximation is applied to the ME node. The convex meshfree approximation has Knonecker-delta property at the element's boundary and is constructed using a special meshfree treatment referred to as generalized meshfree (GMF) procedure. The gradient matrix of ME-FEM element satisfies integration constraint. The ME-FEM interpolation is an element-wise meshfree interpolation that is discrete divergence-free at the incompressible limit. Divergence-free property is provided by meshfree enrichment in quadrilateral elements. For triangular and tetrahedral elements, divergence-free property is provided by a combination of meshfree enrichment and strain smoothing procedure.

According to another aspect, the displacement based first-order convex meshfree approximation uses at basis function derived from an exponential, an inverse tangent, a hyperbolic tangent or Renyi function.

Optionally in another aspect, the finite elements can be divided into first and second groups. Only the finite elements belong to the first group are enriched (i.e., adding one or more ME nodes). In other words, ME-FEM can include regular finite elements (i.e., second group) and meshfree enriched elements (i.e., first group).

According to yet another aspect, the ME-FEM element is configured to avoid possible pressure oscillation in simulations of structural behaviors in near-incompressible region. To achieve this goal, an area-weighted integration is incorporated with the divergence-free ME-FEM interpolation, which provides smoothing effect on strains and pressures. The area-weighted integration further provides divergence-free property particularly in triangular and tetrahedral elements.

According to still another aspect, a modified Hu-Washizu variational principle is used for creating discrete equations with the smoothed strain field.

As a result of using ME-FEM elements, numerical simulations of structural behaviors in compressible and/or near-incompressible region can be performed with reasonable accuracy for assisting user (i.e., engineers, scientists, etc.) to improve design of an engineering product (i.e., car, airplane, etc.).

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 5A and 5B show a non-physical mode using the original meshfree method and a realistic mode using ME-FEM, according to an embodiment of the present invention;

DETAILED DESCRIPTION

Figure 1A:
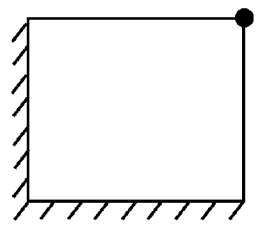
FIG. 1A is a diagram showing a finite element to demonstrate volumetric locking.
Figure 1B:
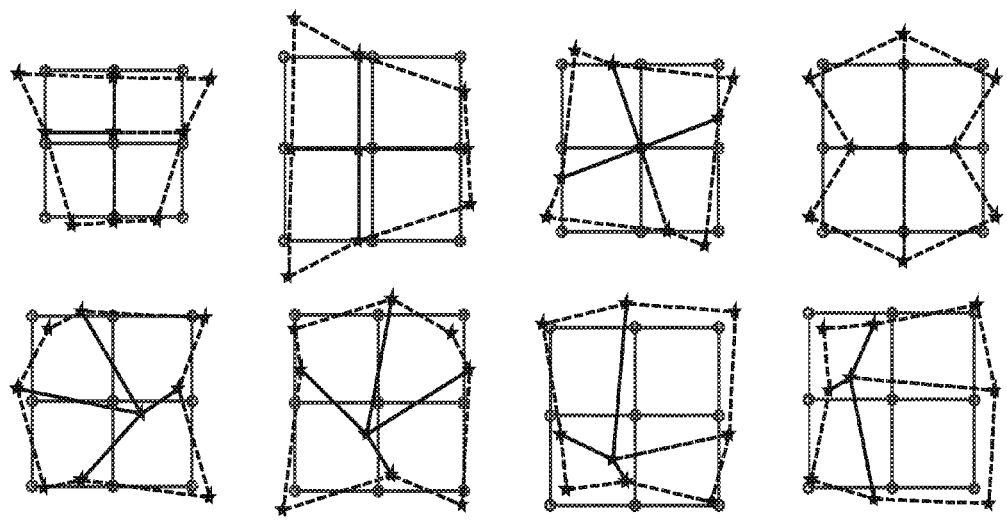
FIG. 1B is a diagram showing various non-physical modes for 3×3 discretization.
Figure 1C:
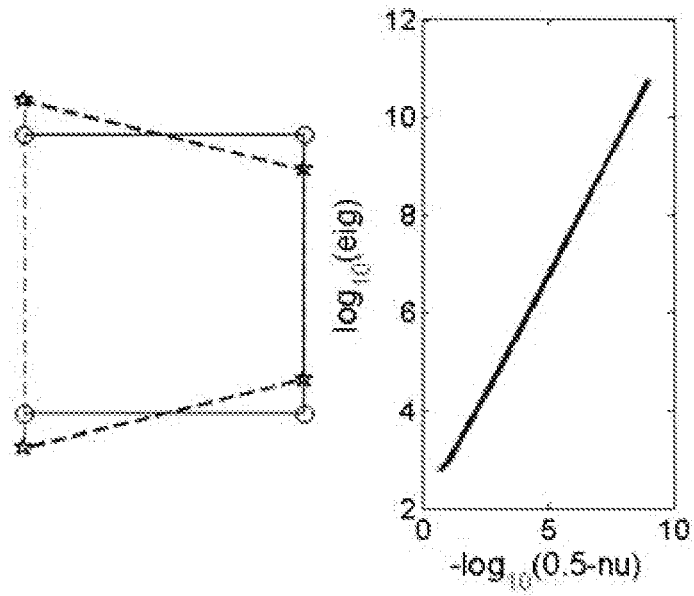
FIGS. 1C and 1D are diagrams showing two non-physical modes for Q1 bilinear finite element.
Figure 1D:
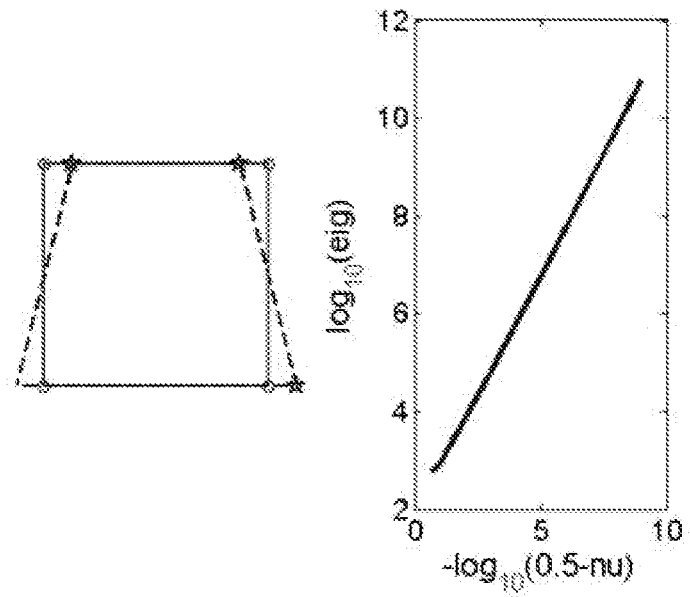

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-9. However, those skilled in the art will readily appreciate that the detailed description given herein with respect to these figures is for explanatory purposes as the invention extends beyond these limited embodiments.

The present invention is directed to methods and systems for numerical simulation of structural behaviors using ME-FEM. One of the techniques used in ME-FEM is called generalized meshfree (GMF) approximation or procedure.

Generalized Meshfree (GMF) Approximation

A first-order GMF convex approximation is introduced to approximate the displacement field for ME-FEM. Implementation of meshfree convex approximation imposes the weak Kronecker-delta property at the boundaries of each finite element and therefore the essential boundary condition can be easily treated. Fundamental idea of the GMF approximation is to introduce an enriched basis function in the Shepard function and its satisfaction of linear consistency. The selection of the enriched basis function determines whether the GMF approximation has convexity property. A convex hull conv($\Lambda$) of a node set $\Lambda = \{x_i, i=1, \ldots n\} \subset \mathbb{R}^2$ is defined by $$conv(\Lambda) = \left\{ \sum_{i=1}^{n} \alpha_i x_i \,\bigg|\, x_i \in \Lambda, \alpha_i \in \mathbb{R}, \alpha_i \geq 0, \sum_{i=1}^{n} \alpha_i = 1, i = 1, 2, \ldots \right\} \quad (12)$$

The GMF procedure is used for constructing convex approximations of a given smooth function u, that has the form $$u^h(x) = \sum_{i=1}^{n} \Psi_i(x) u_i$$

with the generating function $\Psi_i$: conv($\Lambda$)→R satisfying a polynomial reproduction property. An exemplary polynomial reproduction property is expressed as $$\sum_{i=1}^{n} \Psi_i(x) x_i = x \,\forall\, x \in conv(\Lambda).$$

First-order GMF approximation in multi-dimension can be written as follows:

$$\Psi_i(x, \lambda_r) = \frac{\psi_i}{\psi} = \frac{\phi_a(x; X_i)\Gamma_i(X_i, \lambda_r)B(X_i, \lambda_r, \Theta)}{\sum_{j=1}^{n} \phi_a(x; X_j)\Gamma_j(X_j, \lambda_r)B(X_j, \lambda_r, \Theta)} \quad (13)$$

subject to linear constraints $$R_r(x, \lambda_r) = \sum_{i=1}^{n} \Psi_i X_i = 0 \quad (14)$$

where:

$$\psi_i = \phi_a(x; X_i)\Gamma_i(X_i, \lambda_r)B(X_i, \lambda_r, \Theta) \quad (15)$$

$$\psi = \sum_{i=1}^{n} \psi_i = \sum_{i=1}^{n} \phi_a(x; X_i)\Gamma_i(X_i, \lambda_r)B(X_i, \lambda_r, \Theta) \quad (16)$$

$$X_i = x - x_i \quad (17)$$

$\phi_a(x; X_i)$: weight function of node i with support size supp($\phi_a(x; X_i)$)=$a_i$, $\Gamma_i(X_i, \lambda_r)$: the basis function of the GMF approximation, x: the coordinate of interior point (i.e., a fixed point),
$x_i$: the coordinate of node i,
n: the number of nodes within the support size a(x) at the fixed point x,
$\lambda_r(x)$ (r=1, 2, ..., m): constraint parameters which have to be decided,
m: the number of constraints (m=1 in one dimension, m=2 in two-dimension, and m=3 in three-dimension),
$B(X_i, \lambda_r, \Theta)$: a blending function and $\Theta$ is internal functions or variables.

In the GMF approximation, the property of the partition of unity is automatically satisfied with the normalization in Eq. (13). Blending function $B(X_i, \lambda_r, \Theta)$ is introduced to modify the basis function for the generation of a particular GMF approximation with special purposes, for example, satisfying the weak Kronecker-delta property for the non-convex approximation. In constructing the first-order convex approximation, blending function $B(X_i, \lambda_r, \Theta)$ is a unity. Furthermore, the GMF approximation is completed by finding $\lambda$ to satisfy Eq. (14), which is a constraint equation guaranteeing the GMF approximation to have linear consistency. To determine $\lambda$ at any fixed point x in Eq. (13), a root-finding algorithm is required and used for non-linear basis functions.

Convexity of the GMF approximation is determined by the selection of a positive basis function in Eq. (13). Table 1 summarizes various basis functions typically used for generating either convex or non-convex GMF approximations. A combination of basis functions or other monotonically increasing or decreasing functions can also be considered as other kinds of GMF basis functions.

The GMF(exp) approximation listed in Table 1 is known as the meshfree-enriched (ME) approximation with Shannon entropy, while the GMF(MLS) approximation is as the Moving Least Squares (MLS) or the Reproducing Kernel (RK) approximation. Additionally, the GMF(Renyi) approximation is the ME approximation with Renyi entropy. Moreover, the GMF approximation can be extended to the higher-order, which can be used for improving accuracy of meshfree methods. A convex GMF approximation constructed using an inverse tangent basis function is employed in the displacement approximation for the ME-FEM method and is denoted by GMF(atan) in Table 1. A cubic spline window function with a rectangular support is chosen as the weight function in Eq. (15). The rectangular support is used because it can fit the isoparametric mapping domain of a quadrilateral element.

Enriched Finite Element Interpolation by GMF Approximation

Figure 2A:
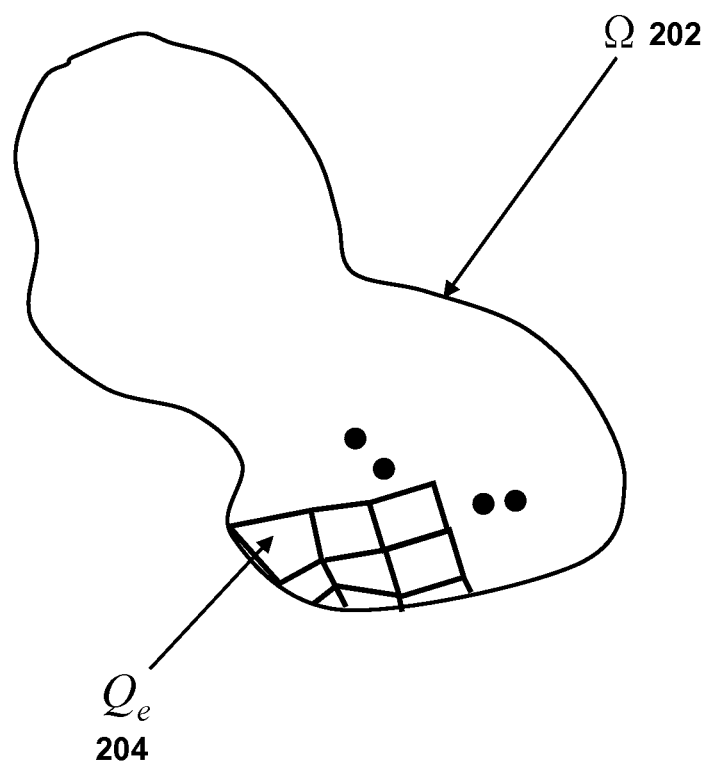
FIG. 2A is a diagram showing an exemplary domain is divided or triangulated into a number of finite elements.

Let $M_h = \cup_e Q_e$ be the regular division (sometimes referred to as triangulation) of a domain $\Omega$ 202 shown in FIG. 2A into convex quadrilateral elements 204 (only few shown). Each element $Q_e$ 204 contains four corner nodes $N_i$, $1 \le i \le 4$ 206a-d and at least one meshfree enriched (ME) node 208 $K_i$, $1 \le i \le nb$. The quantity nb is the number of enriched nodes in the element $Q_e$ 204. The element $Q_e$ 204 can also be transformed into an image of a reference square 214 $\overline{Q}_e[-1,1] \times [-1,1]$ through an isoparametric mapping represented in a vector form as follows:

$$x = F_e(\xi) \quad (18)$$

where $x = [x,y]^T$ and $\xi = [\xi, \eta]^T$.

Figure 2B:
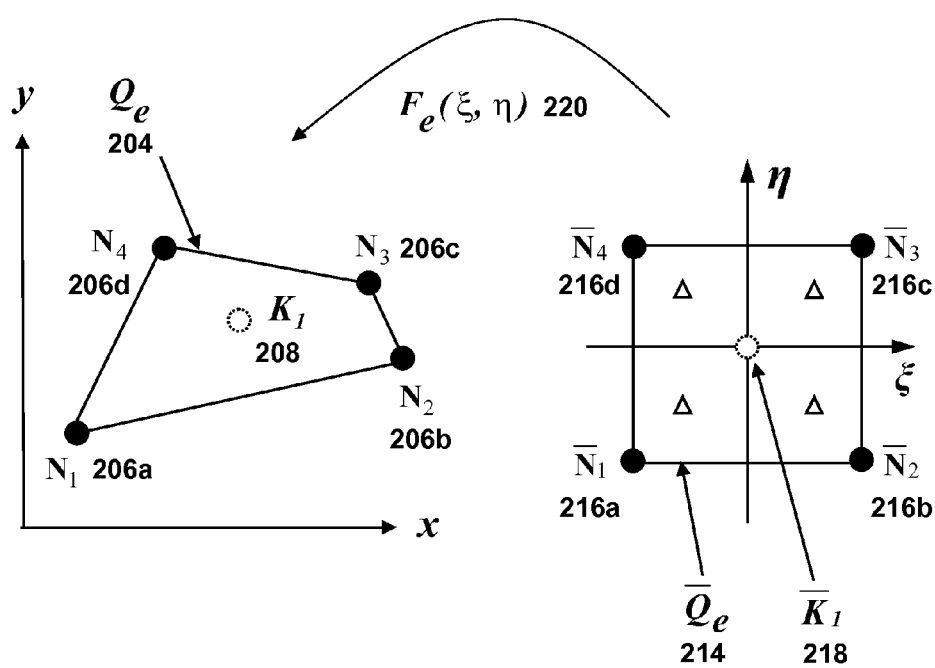
FIG. 2B is a diagram showing an exemplary isoparametric mapping scheme used in a 5-noded meshfree-enriched finite element (quadrilateral element) in accordance with one embodiment of the present invention.

The mapping function $F_e$ 220 maps the reference square $\overline{Q}_e$ 214 to a general irregular element $Q_e$ 204. For illustration and description simplicity, a five-noded meshfree enriched (ME) finite element 204 with the fifth node $K_1$ 208 located at the center of the element is shown in FIG. 2B (i.e., nb is equal to one (1) for this example). Various procedures of meshfree enrichment using different number of nodes and different meshfree convex approximation can be facilitated to achieve substantially similar objective.

Because shape functions of an element are constructed by the meshfree convex approximation, the shape functions exhibit the following convexity properties $$\Psi_i(\xi_j) = \delta_{ij} \quad 1 \le i,j \le 4$$

$$\Psi_5(\xi) < 0 \quad \forall \xi \in \overline{Q}_e$$

$$\Psi_5(\xi) = 0 \quad \forall \xi \in \partial \overline{Q}_e \quad (19)$$

Assuming that each node is assigned to a weight function with same rectangular support $\text{supp}(\phi_a(\xi; \xi_i)) = a_i = a$ in the reference square $\overline{Q}_e$ 214, the tensor product weight function $\phi_a(x; X_i)$ in Eq. (15) is defined as follows:

$$\phi_a(\xi; \xi_i) : \overline{Q}_e \to [0, 1] \phi_a(\xi; \xi_i) = \phi\left(\frac{\xi - \xi_i}{a}\right) \phi\left(\frac{\eta - \eta_i}{a}\right) \quad (20)$$

Based on the above assumption, there exist certain symmetry properties in the shape functions and their derivatives.

TABLE 1

Examples of basis functions in the GMF approximations

| Convexity | Basis function | Abbreviation | Note |
|---|---|---|---|
| Convex approximation | $e^x$ | GMF(exp) | ME Approximation (Shannon entropy) |
|  | $1 + \tanh(x)$ | GMF(tanh) | New approximation |
|  | $1 + \frac{2}{\pi}\tan^{-1}(x)$ | GMF(atan) | New approximation |
| Non-convex approximation | $\left(1 + \frac{1-\alpha}{\alpha}x\right)^{\frac{1}{\alpha-1}}$ (Renyi basis function) | GMF(Renyi) | ME Approximation (Renyi entropy) ($0.5 < \alpha < 1 0.5 < \alpha < 1$) MLS approximation ($\alpha = 2 \alpha = 2$) |
|  | $1 + x$ | GMF(MLS) | MLS approximation |
|  | $1 + x^3$ | GMF($x^3$) | New approximation |
|  | $e^x(1 + x^3)$ | GMF(exp · $x^3$) | New approximation |

Using the five-noded ME-FEM shape functions, the isoparametric mapping function $F_e(\xi)$ 220 in Eq. (18) can be defined as follows:

$$F_e : \overline{Q}_e \to Q_e, \quad (21)$$

$$x = F_e(\xi) = (F_e^1, F_e^2) = \left( \sum_{i=1}^{5} x_i \Psi_i(\xi, \eta), \sum_{i=1}^{5} y_i \Psi_i(\xi, \eta) \right) \text{ for all } \xi \in \overline{Q}_e$$

With the above notations, the following approximation space for the displacement field is then defined.

$$V^h(\Omega) = \{ u^h : u^h \in [H_0^1]^2, u^h|_{Q_e} = \overline{u}^h \circ F_e^{-1}, \overline{u}^h \in P_1(\overline{Q}_e) \text{ for all } Q_e \in M_h \} \quad (22)$$

where $P_1(\overline{Q}_e) = \text{span} \{\Psi_i, i=1\ldots 5\}$ denotes the space contains a set of basis functions in reference square $\overline{Q}_e$ 214.

The fifth or ME node in the ME finite element provides a function similar to the bubble function in the incompatible or enhanced strain elements in the traditional finite element method. However, the basis function associated with the fifth node is not orthogonal to the basis function associated with the corner node due to its dependence of meshfree shape functions. Thus the fifth node cannot be eliminated by the static condensation procedure in a ME finite element. Unlike the unknown coefficients of the traditional or classical bubble function, the fifth node carries physical displacements. In computing the ME finite element's body force vectors, the fifth node must be considered. According to Eq. (21), the isoparametric mapping at the fifth node reads $$(x_5, y_5) = F_e(0, 0) = \left( \sum_{i=1}^{5} x_i \Psi_i(0, 0), \sum_{i=1}^{5} y_i \Psi_i(0, 0) \right) \quad (23)$$

Consequently, the global co-ordinates of the fifth node is determined by $$(x_5, y_5) = \left( \frac{\sum_{i=1}^{4} \Psi_i(0,0) x_i}{(1 - \Psi_5(0,0))}, \frac{\sum_{i=1}^{4} \Psi_i(0,0) y_i}{(1 - \Psi_5(0,0))} \right) = \quad (24)$$

$$\left( \frac{\sum_{i=1}^{4} \Psi_i(0,0) x_i}{\sum_{i=1}^{4} \Psi_i(0,0)}, \frac{\sum_{i=1}^{4} \Psi_i(0,0) y_i}{\sum_{i=1}^{4} \Psi_i(0,0)} \right) = \left( \frac{\sum_{i=1}^{4} x_i}{4}, \frac{\sum_{i=1}^{4} y_i}{4} \right)$$

which is the centroid of the quadrilateral (i.e., the 5-node ME finite element 204).

Figure 2C:
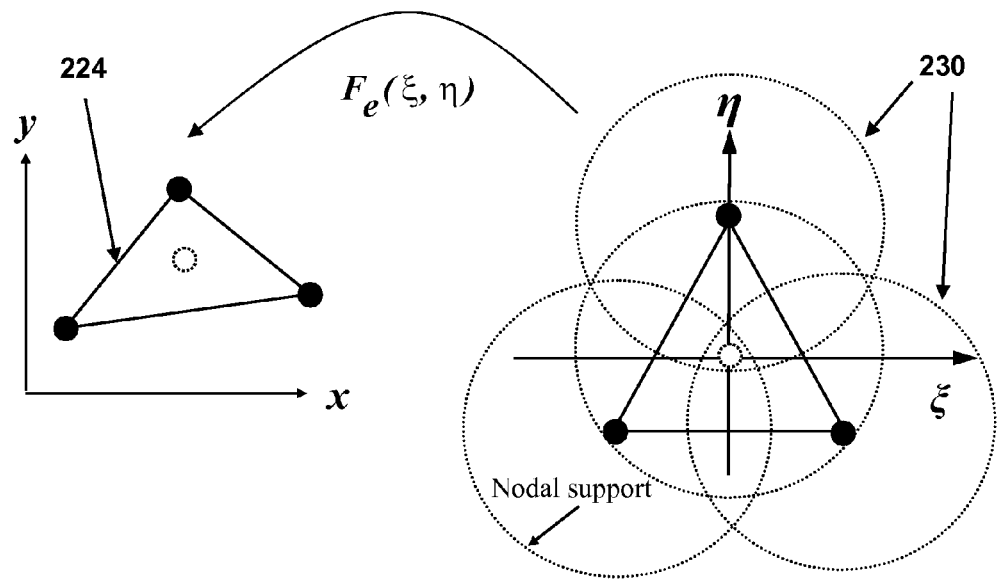
FIG. 2C is a diagram showing an exemplary isoparametric mapping scheme used in a 4-noded meshfree-enriched finite element (triangular element) in accordance with one embodiment of the present invention.

For a 4-noded meshfree-enriched finite element (triangular element 224 having three corner nodes shown as solid dots and one ME node shown as a circle), an exemplary isoparametric mapping scheme is shown in FIG. 2C. It can be seen circular supports 230 are used for the triangular element 224 instead of the rectangular support for the quadrilateral element 204.

Figure 2D:
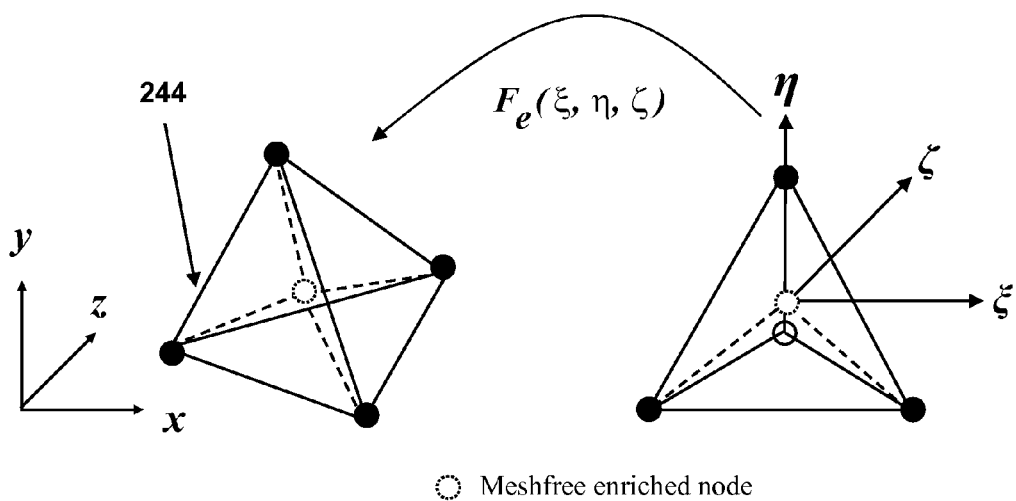
FIG. 2D is a diagram showing an exemplary isoparametric mapping scheme used in a 5-noded meshfree-enriched finite element (tetrahedral element) in accordance with one embodiment of the present invention.

Further, the present invention can apply to a three-dimensional element (i.e., tetrahedral element 244) shown in FIG. 2D, in which an exemplary isoparametric mapping scheme is illustrated.

Figure 3A:
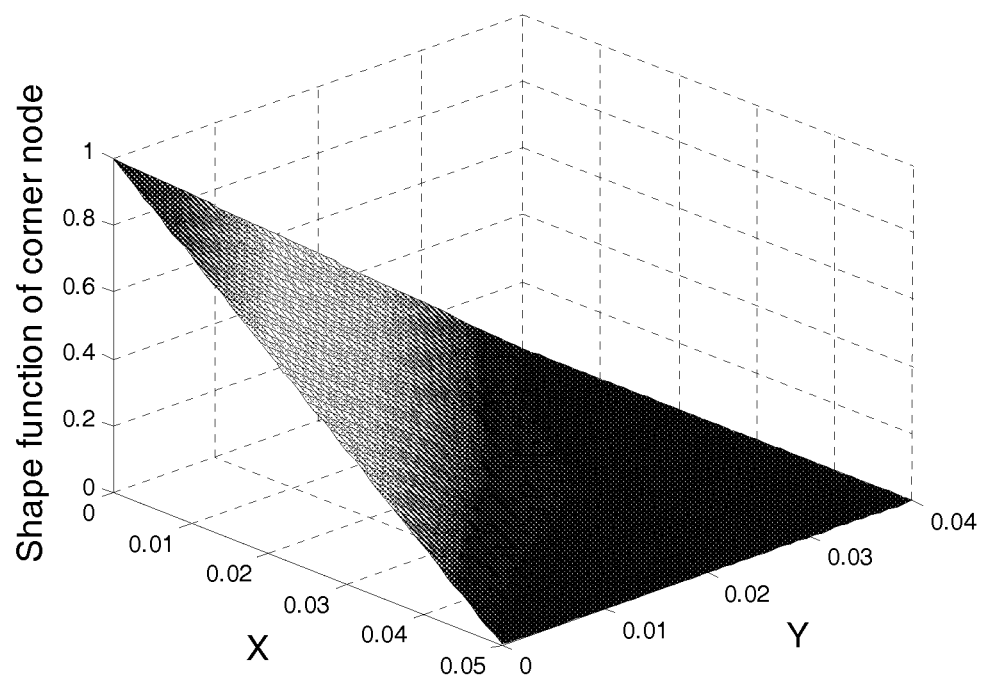
FIGS. 3A and 3B are diagrams showing shape functions for an exemplary meshfree-enriched finite element in accordance with one embodiment of the present invention.
Figure 3B:
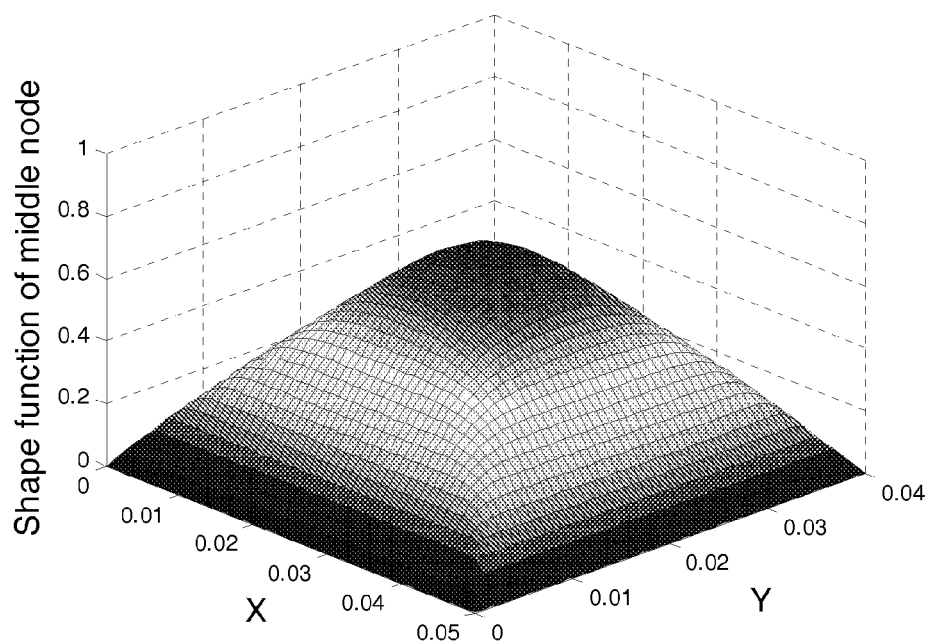

FIG. 3A shows an exemplary shape function of one of the corner nodes 206a-d, while FIG. 3B shows an exemplary shape function of the meshfree enriched (ME) node 208 (i.e., middle node or fifth node). These shape functions are results of GMF(atan) approximation in a five-noded ME-FEM element 204 which shows the Kronecker-delta property at the boundary. The shape functions of the ME-FEM element reduce to the standard bilinear finite element shape functions along the element edge that exhibit the convexity approximation property. It is noted that the derivatives of the shape functions (listed in Eq, (79) below) in the five-noded ME-FEM element 204 do not degenerate to the finite element derivatives along the element edge due to the non-zero value of derivatives of the ME or fifth node 208.

The Jacobian matrix $J_\xi$ is defined to be the gradient of the mapping function $F_e$ by $$J_{ij} = \frac{\partial F_e^i(\xi)}{\partial \xi_j}, \, i, j = 1, 2 \quad (25)$$

or in matrix form $$J_\xi = G_F G_F^T \quad (26)$$

where matrices $G_F$ and $G_x$ are defined as follows:

$$G_F = \nabla_{(\xi,\eta)} [\Psi_i(\xi, \eta)]_e = \begin{bmatrix} \frac{\partial \Psi_1}{\partial \xi} & \cdots & \frac{\partial \Psi_5}{\partial \xi} \\ \frac{\partial \Psi_1}{\partial \eta} & \cdots & \frac{\partial \Psi_5}{\partial \eta} \end{bmatrix} \quad (27)$$

$$G_x = \begin{bmatrix} x_1 & \cdots & x_5 \\ y_1 & \cdots & y_5 \end{bmatrix} \quad (28)$$

$$\nabla_{(\xi,\eta)} = \begin{bmatrix} \frac{\partial}{\partial \xi} \\ \frac{\partial}{\partial \eta} \end{bmatrix} \quad (29)$$

Analytical proof of invertibility of the mapping function $F_e$ (or non-singularity of the Jacobian) is not an easy task due to the rational nature of the meshfree shape functions and should be addressed by the inverse function theorem. In engineering applications, it is more common to examine the invertibility at the Gauss integration points used for quadrature of the ME element 204.

The isoparametric mapping in the five-noded ME-FEM quadrilateral element 204 preserves the global element area $A_e$ numerically, where $$A_e = \int_{\Omega_e} d\Omega = \int_{-1}^{1} \int_{-1}^{1} \det(J) d\xi d\eta = \sum_{J=1}^{4} \det(J_\xi)_J.$$

In other words, the sum of $\det(J_\xi)$ using a 2×2 Gaussian integration scheme preserves the area of global element $Q_e$ 204 despite the ME-FEM element shape functions and their derivatives are rational functions and the nodal support sizes are adjustable.

Proof

From Eq. (26), the area of global element $Q_e$ is obtained using the conventional 2×2 Gaussian integration given by $$A_e = \sum_{J=1}^{4} \det(J_\xi)_J \qquad (30)$$

$$= \sum_{J=1}^{4} \det(G_F(\xi_{gJ})G_x^T)$$

$$= \sum_{J=1}^{4} \begin{pmatrix} \sum_{I=1}^{5} \frac{\partial \Psi_I(\xi_{gJ})}{\partial \xi} x_I \cdot \sum_{I=1}^{5} \frac{\partial \Psi_I(\xi_{gJ})}{\partial \eta} y_I - \\ \sum_{I=1}^{5} \frac{\partial \Psi_I(\xi_{gJ})}{\partial \xi} y_I \cdot \sum_{I=1}^{5} \frac{\partial \Psi_I(\xi_{gJ})}{\partial \eta} x_I \end{pmatrix}$$

The first-order consistency condition gives $$G_F(\xi_{gi})G_\xi^T = I \text{ for } i = 1, 2, 3, 4 \qquad (31)$$

$$G_\xi = \begin{bmatrix} -1 & 1 & -1 & -1 & 0 \\ -1 & -1 & 1 & 1 & 0 \end{bmatrix} \qquad (32)$$

Using the symmetry properties in Eq. (79) together with the first-order consistency conditions leads to the following explicit expression of $A_e$ $$A_e = \frac{(-x_1 + x_2 + x_3 - x_4) \cdot (-y_1 - y_2 + y_3 + y_4) -}{2} \qquad (33)$$
$$\phantom{A_e =}\frac{(-y_1 + y_2 + y_3 - y_4) \cdot (-x_1 - x_2 + x_3 + x_4)}{2}$$

$A_e$ is the exact area of global element $Q_e$ 204 and is independent of co-coordinates or location of the ME or fifth node 208 and nodal support size a. Furthermore, the ME-FEM formulation preserves the linear exactness in the Galerkin approximation of Dirichlet boundary value problem. i.e.

$$\int_\Omega B_I d\Omega = 0 \text{ or } \int_\Omega b_I d\Omega = 0 \; \forall \text{ interior node } I \in \Omega \cup \Gamma \qquad (34)$$

which is known as integration constraints (IC) in meshfree Galerkin method. In Eq. (34), $B_I$ is the gradient matrix which is given by $$B_I(\xi) = \begin{bmatrix} \frac{\partial \Psi_I(\xi)}{\partial x} & 0 \\ 0 & \frac{\partial \Psi_I(\xi)}{\partial y} \\ \frac{\partial \Psi_I(\xi)}{\partial y} & \frac{\partial \Psi_I(\xi)}{\partial x} \end{bmatrix} \qquad (35)$$

and $$b_I(\xi) = \begin{bmatrix} \frac{\partial \Psi_I(\xi)}{\partial x} \\ \frac{\partial \Psi_I(\xi)}{\partial y} \end{bmatrix}$$

is a vector of the shape function derivatives of node I.

Proof

First consider the case that interior node is the center node $K_1$ 208 of the global element $Q_e$ 204. In each element, $$\int_{Q_e} b_5 d\Omega = \int_{-1}^{1} \int_{-1}^{1} \overline{b}_5 \det(J_\xi) d\xi d\eta \qquad (36)$$

$$= \int_{-1}^{1} \int_{-1}^{1} J_\xi^{-1} \cdot \overline{b}_5 \det(J_\xi) d\xi d\eta$$

$$= \int_{-1}^{1} \int_{-1}^{1} J_\xi^* \cdot \overline{b}_5 d\xi d\eta$$

$$= \begin{bmatrix} \sum_{j=1}^{4} \left( \left( \sum_{i=1}^{5} y_i \frac{\partial \Psi_i(\xi_{gj})}{\partial \eta} \right) \frac{\partial \Psi_5(\xi_{gj})}{\partial \xi} - \right) \\ \phantom{\sum_{j=1}^{4}} \left( \left( \sum_{i=1}^{5} y_i \frac{\partial \Psi_i(\xi_{gj})}{\partial \xi} \right) \frac{\partial \Psi_5(\xi_{gj})}{\partial \eta} \right) \\ \sum_{j=1}^{4} \left( \left( \sum_{i=1}^{5} x_i \frac{\partial \Psi_i(\xi_{gj})}{\partial \eta} \right) \frac{\partial \Psi_5(\xi_{gj})}{\partial \xi} - \right) \\ \phantom{\sum_{j=1}^{4}} \left( \left( \sum_{i=1}^{5} x_i \frac{\partial \Psi_i(\xi_{gj})}{\partial \xi} \right) \frac{\partial \Psi_5(\xi_{gj})}{\partial \eta} \right) \end{bmatrix}$$

$$= \begin{bmatrix} \sum_{i=1}^{5} y_i \sum_{j=1}^{4} \left( \frac{\partial \Psi_i(\xi_{gj})}{\partial \eta} \frac{\partial \Psi_5(\xi_{gj})}{\partial \xi} - \frac{\partial \Psi_i(\xi_{gi})}{\partial \xi} \frac{\partial \Psi_5(\xi_{gi})}{\partial \eta} \right) \\ \sum_{i=1}^{5} x_i \sum_{j=1}^{4} \left( \frac{\partial \Psi_i(\xi_{gj})}{\partial \eta} \frac{\partial \Psi_5(\xi_{gj})}{\partial \xi} - \frac{\partial \Psi_i(\xi_{gi})}{\partial \xi} \frac{\partial \Psi_5(\xi_{gi})}{\partial \eta} \right) \end{bmatrix}$$

$$= \begin{bmatrix} \sum_{i=1}^{5} y_i g_{i5} \\ \sum_{i=1}^{5} x_i g_{i5} \end{bmatrix}$$

where $$\overline{b}_I = \nabla_{(\xi,\eta)} \Psi_I = \begin{bmatrix} \frac{\partial \Psi_I(\xi, \eta)}{\partial \xi} \\ \frac{\partial \Psi_I(\xi, \eta)}{\partial \eta} \end{bmatrix} \qquad (37)$$

$$J_\xi^*(\xi) = det(J_\xi) \qquad (38)$$

$$g_{il} = \sum_{j=1}^{4} \left( \frac{\partial \Psi_i(\xi_{gJ})}{\partial \eta} \frac{\partial \Psi_I(\xi_{gj})}{\partial \xi} - \frac{\partial \Psi_i(\xi_{gi})}{\partial \xi} \frac{\partial \Psi_I(\xi_{gj})}{\partial \eta} \right) \qquad (39)$$

Using the symmetry properties in Eq. (79), a calculation leads to $$\int_{Q_e} b_5 d\Omega = 0 \qquad (40)$$

Figure 4:
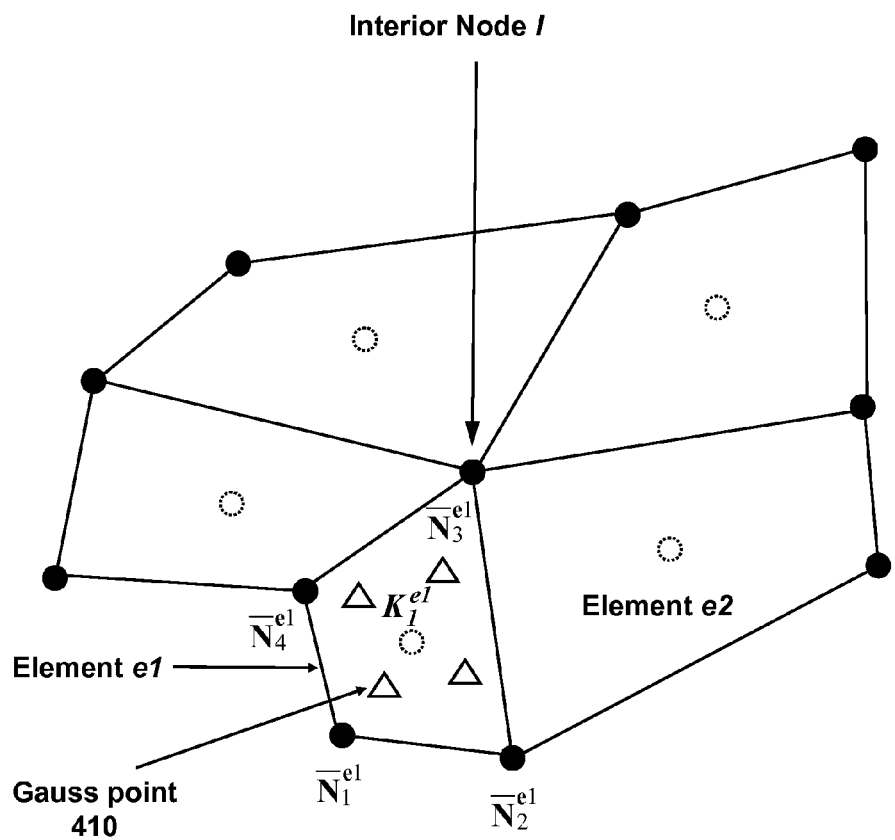
FIG. 4 is a diagram showing relationship between an interior node with its neighbor elements in accordance with an embodiment of the present invention.

Let's next consider an interior node $I = N_3^{e1}$ connected by several neighboring elements where the superscript "e1" denotes the element number and subscript "3" is the node number of that particular element shown in FIG. 4. Similar to the above derivation, we have $$\int_{Q_e} b_3^{e1} d\Omega = \int_{-1}^{1}\int_{-1}^{1} b_3^{e1} \det(J_\xi^{e1}) d\xi d\eta \qquad (41)$$

$$= \begin{bmatrix} \sum_{j=1}^{4}\left(\left(\sum_{i=1}^{5} y_i^{e1}\dfrac{\partial\Psi_i(\xi_{gj})}{\partial\eta}\right)\dfrac{\partial\Psi_3(\xi_{gj})}{\partial\xi} - \left(\sum_{i=1}^{5} y_i^{e1}\dfrac{\partial\Psi_i(\xi_{gj})}{\partial\xi}\right)\dfrac{\partial\Psi_3(\xi_{gj})}{\partial\eta}\right) \\ \sum_{j=1}^{4}\left(\left(\sum_{i=1}^{5} x_n^{e1}\dfrac{\partial\Psi_i(\xi_{gj})}{\partial\eta}\right)\dfrac{\partial\Psi_3(\xi_{gj})}{\partial\xi} - \left(\sum_{i=1}^{5} x_i^{e1}\dfrac{\partial\Psi_i(\xi_{gj})}{\partial\xi}\right)\dfrac{\partial\Psi_3(\xi_{gj})}{\partial\eta}\right) \end{bmatrix}$$

$$= \begin{bmatrix} y_2^{e1}g_{23}^{e1} + y_4^{e1}g_{43}^{e1} + y_5^{e1}g_{53}^{e1} \\ x_2^{e1}g_{23}^{e1} + x_4^{e1}g_{43}^{e1} + x_5^{e1}g_{53}^{e1} \end{bmatrix}$$

The result in Eq. (41) is independent of the co-coordinates of node $N_3^{e1}$ and its diagonal node $N_1^{e1}$ in element e1. For adjacent elements e1 and e2, $$\int_{Q_{e1}} b_3^{e1} d\Omega + \int_{Q_{e2}} b_4^{e2} d\Omega = \qquad (42)$$

$$\begin{bmatrix} y_2^{e1}g_{23}^{e1} + y_4^{e1}g_{43}^{e1} + \\ y_5^{e1}g_{53}^{e1} \\ x_2^{e1}g_{23}^{e1} + x_4^{e1}g_{43}^{e1} + \\ x_5^{e1}g_{53}^{e1} \end{bmatrix} + \begin{bmatrix} y_1^{e2}g_{14}^{e2} + y_3^{e2}g_{34}^{e2} + \\ y_5^{e2}g_{54}^{e2} \\ x_1^{e2}g_{14}^{e2} + x_3^{e2}g_{34}^{e2} + \\ x_5^{e2}g_{54}^{e2} \end{bmatrix}$$

Using the relationships $x_2^{e1}=x_1^{e2}$, $y_2^{e1}=y_1^{e2}$ and $g_{23}^{e1}=g_{14}^{e2}$, Eq. (42) is rewritten as $$\int_{Q_{e1}+Q_{e2}} b_I^{e1} + b_I^{e2} d\Omega = \begin{bmatrix} y_4^{e1}g_{43}^{e1} + y_5^{e1}g_{53}^{e1} \\ x_4^{e1}g_{43}^{e1} + x_5^{e1}g_{53}^{e1} \end{bmatrix} + \begin{bmatrix} y_3^{e2}g_{34}^{e2} + y_5^{e2}g_{54}^{e2} \\ x_3^{e2}g_{34}^{e2} + x_5^{e2}g_{54}^{e2} \end{bmatrix} \qquad (43)$$

It is noted that $I=N_3^{e1}=N_4^{e2}$ from FIG. 4. Subsequently, for multiple elements n1 one can easily verify that $$\int_\Omega b_I d\Omega = \sum_{n=1}^{nl} \int_{-1}^{1}\int_{-1}^{1} b_I^n \det(J_\xi^n) d\xi d\eta = 0 \qquad (44)$$

Locking-Free Meshfree-Enriched Finite Element Formulation Divergence-Free Meshfree-Enriched Finite Element Interpolation From the nearly incompressible problem in Eq. (9), the error between the exact solution u and the unique solution $u^h$ is obtained from a standard displacement-based Galerkin method is estimated and expressed as the energy error norm by $$\|u-u^h\|_E^2 \le C_0 \inf_{v^h\in V^h}\|u-v^h\|_E^2 \le C_0\|u-\prod_h u\|_E^2 = \qquad (45)$$

$$C_0 A\left(u-\prod_h u, u-\prod_h u\right) =$$

$$C_0\left(2\mu\left|u-\prod_h u\right|^2 + \lambda\left\|\nabla\cdot\left(u-\prod_h u\right)\right\|_{0,\Omega}^2\right)$$

The energy norm in Eq. (45) is defined by $$\|u\|_E = (A(u,u))^{\frac{1}{2}} \qquad (46)$$

$\Pi_h: H^1(\Omega) \to V^h(\Omega)$ is an interpolation operator associated with the isoparametric mapping $F_e$ 220 in Eq. (21) and defined by $$\Pi_h u = \overline{\Pi}_h(u\circ F_e)\circ F_e^{-1} \qquad (47)$$

where $\overline{\Pi}_h: H^1(\overline{Q}_e) \to P_1(\overline{Q}_e)$ is a projection operator that preserves polynomials of degree$\le 1$; i.e., $\overline{\Pi}_h p = p$, $\forall p\in P_1(\overline{Q}_e)$ and $P_1(\overline{Q}_e)$ is the space of polynomials of degree$\le 1$ on $\overline{Q}_e$. $\|\bullet\|_m$ and $|\bullet|_m$ are Sobolev norm and semi-norm of order m, respectively. Constant $C_0$ in Eq. (45) does not dependent on the element size h and the functions considered. It is noted that the well-known Céa's lemma for the first inequality in Eq. (45) is used to estimate the error. Let's further assume the regularity on the solution $u\in H^2(\Omega)$ and use the approximation property for the first-order approximation to yield the global approximation error $$\|u-u^h\|_E^2 \le C_0\left(2\mu\left|u-\prod_h u\right|_{1,\Omega}^2 + \lambda\left\|\nabla\cdot\left(u-\prod_h u\right)\right\|_{0,\Omega}^2\right) \le \qquad (48)$$

$$C_{01}\mu h^2|u|_{2,\Omega}^2 + C_{10}\lambda h^2|\nabla\cdot u|_{1,\Omega}^2 \le C_{11} h^2(|u|_{2,\Omega}^2 + \lambda|\nabla\cdot u|_{1,\Omega}^2)$$

From Eq. (48) it is clear that solution $u^h$ will converge to the exact solution u as mesh is refined in the compressible case. However the convergence of $u^h$ may not be achieved by a low-order approximation as $\lambda\to\infty$. For the energy error norm to be bounded in the incompressible limit, the divergence-free condition has to be enforced strongly using a high-order approximation or enforced weakly by a mixed/reduced integration/modified variational form strategy and guarded by the inf-sup condition.

Instead of enforcing the divergence-free condition weakly, the divergence-free condition is enforced strongly but pointwise at the Gaussian quadrature points 410 (shown as triangles in FIG. 4). That is, $$\nabla\cdot u^h(\xi_{gi})|_{Q_e}\to 0 \text{ as } \lambda\to\infty \forall Q_e\in M_h, i=1,2,3,4 \text{ are Gauss points} \qquad (49)$$

The approximation of the divergence $\nabla\cdot u^h$ is evaluated at the Gauss points 410, which can be expressed by $$\nabla\cdot u^h = (\xi_{gi}) = tr(\nabla u^h(\xi_{gi})) = tr(J_\xi^{-1}\cdot\nabla_{(\xi,\eta)} u^h(\xi_{gi})) = tr((G_F G_x^T)^{-1}\cdot\nabla_{(\xi,\eta)} u^h(\xi_i)) \qquad (50)$$

where $\xi_{gi}=(\xi_{gi},\eta_{gi})$, i=1, 2, 3, 4 are Gauss points 410. The term $\nabla_{(\xi,\eta)} u^h(\xi_{gi})$ in Eq. (50) is rewritten as $$\nabla_{(\xi,\eta)} u^h(\xi_{gi}) = \begin{bmatrix} \dfrac{\partial\Psi_1(\xi_{gi})}{\partial\xi} & \cdots & \dfrac{\partial\Psi_5(\xi_{gi})}{\partial\xi} \\ \dfrac{\partial\Psi_1(\xi_{gi})}{\partial\eta} & \cdots & \dfrac{\partial\Psi_5(\xi_{gi})}{\partial\eta} \end{bmatrix}\begin{bmatrix} u_1 & v_1 \\ \vdots & \vdots \\ u_5 & v_5 \end{bmatrix} = G_F(\xi_{gi})u_e, \qquad (51)$$

$$i=1,2,3,4$$

where $u_e$ is a collection of nodal displacement for the element $Q_e$ 204 given by $$u_e^T = \begin{bmatrix} u_1 & \ldots & u_5 \\ v_1 & \ldots & v_5 \end{bmatrix} \quad (52)$$

To show that the divergence-free condition can be achieved point-wise using the ME-FEM approximation, the eigenvalue analysis is used. Using 5-noded element 204 $Q_e=[-1,1]\times[-1,1]$, the global co-coordinates coincide with the reference co-coordinates. In other words, the Jacobian matrix $J_\xi$ in Eq. (26) becomes $J_\xi=G_F G_x^r=I$ and the expression of divergence $\nabla \cdot u^h$ can be degenerated to a simple form. FIG. 5A illustrates one of the volumetric locking modes 510 in a rectangular bilinear four node finite element where the displacement fields are given in the global co-coordinates by $$[u,v]=[c_1 xy, 0] \quad (53)$$

In Eq. (53), $c_1$ is a coefficient describing the deformation of the locking mode which is a function of nodal displacements. The divergence $\nabla \cdot u^h$ is not null evaluating at all four Gauss points 410 and interpolation does not meet the divergence-free condition of Eq. (49) in the incompressible limit. On the other hand, the divergence $\nabla \cdot u^h$ in same deformation mode using the ME-FEM approximation evaluating at Gauss points 410 can be expressed using Eq. (50) as $$\nabla \cdot u^h(\xi_{gi}) = tr(J_\xi^{-1} \cdot \nabla_{(\xi,\eta)} u^h(\xi_{gi})) \quad (54)$$
$$= tr(I \cdot \nabla_{(\xi,\eta)} u^h(\xi_{gi}))$$
$$= \sum_{k=1}^{5} \Psi_{k,\xi}(\xi_{gi}, \eta_{gi}) u_k + $$
$$\sum_{k=1}^{5} \Psi_{k,\eta}(\xi_{gi}, \eta_{gi}) v_k$$

for $i = 1, 2, 3, 4$

According to Eq. (49), the divergence-free interpolation in ME-FEM element $Q_e$ 204 is $$\nabla \cdot u^h(\xi_{gi})=0 \text{ for } i=1,2,3,4 \quad (55)$$

or in matrix form $$\begin{bmatrix} \Psi_{5,\xi}(\xi_{g1}, \eta_{g1}) & \Psi_{5,\eta}(\xi_{g1}, \eta_{g1}) \\ \Psi_{5,\xi}(\xi_{g2}, \eta_{g2}) & \Psi_{5,\eta}(\xi_{g2}, \eta_{g2}) \\ \Psi_{5,\xi}(\xi_{g3}, \eta_{g3}) & \Psi_{5,\eta}(\xi_{g3}, \eta_{g3}) \\ \Psi_{5,\xi}(\xi_{g4}, \eta_{g4}) & \Psi_{5,\eta}(\xi_{g4}, \eta_{g4}) \end{bmatrix} \begin{bmatrix} u_5 \\ v_5 \end{bmatrix} = \quad (56)$$

$$-\begin{bmatrix} \sum_{k=1}^{4}(\Psi_{k,\xi}(\xi_{g1},\eta_{g1})u_k + \Psi_{k,\eta}(\xi_{g1},\eta_{g1})v_k) \\ \sum_{k=1}^{4}(\Psi_{k,\xi}(\xi_{g2},\eta_{g2})u_k + \Psi_{k,\eta}(\xi_{g2},\eta_{g2})v_k) \\ \sum_{k=1}^{4}(\Psi_{k,\xi}(\xi_{g3},\eta_{g3})u_k + \Psi_{k,\eta}(\xi_{g3},\eta_{g3})v_k) \\ \sum_{k=1}^{4}(\Psi_{k,\xi}(\xi_{g4},\eta_{g4})u_k + \Psi_{k,\eta}(\xi_{g4},\eta_{g4})v_k) \end{bmatrix}$$

The above linear system consists of two unknowns ($u_5$ and $v_5$) and four constraint equations along with the known shape function derivatives evaluated at four Gauss points 410 and eight prescribed nodal displacements. However, the above four constraint equations are not totally independent. Using Eq. (79), we can reduce four constraint equations into two equations and obtain the two unknowns by $$\begin{bmatrix} u_5 \\ v_5 \end{bmatrix} = \begin{bmatrix} c_1 \begin{pmatrix} -\Psi_{1,\xi}(\xi_{g1},\eta_{g1}) - \Psi_{3,\xi}(\xi_{g1},\eta_{g1}) + \\ \Psi_{2,\xi}(\xi_{g1},\eta_{g1}) + \Psi_{4,\xi}(\xi_{g1},\eta_{g1}) \end{pmatrix} \\ \Psi_{5,\eta}(\xi_{g1},\eta_{g1}) \\ 0 \end{bmatrix} \quad (57)$$

The above result demonstrates that the enrichment of the ME node in ME-FEM element can exactly produce two non-locking modes, which are missing in the standard bilinear quadrilateral element. As a result, the overall ME-FEM element behavior is free of volumetric locking. Furthermore, the displacement field of the five-noded ME-FEM element is divergence-free point-wise at the Gauss points 410. Since the shape function derivative $\Psi_{5,\eta}(\xi_{g1},\eta_{g1})$ in Eq. (57) is non-zero (i.e., non-zero everywhere in the element expect at the ME node itself) using the convex approximation, the displacement of the ME node can be uniquely determined. FIG. 5B presents an eigenvalue analysis result using the ME-FEM method. The mode shape 520 is free of volumetric locking A bounded engienvalue near the incompressible limit indicates the ME-FEM element is volumetric locking-free. Results from an eigenanalysis also assure that the ME-FEM element contains no spurious zero-energy mode. Since the volumetric energy term in Eq. (45) is bounded in the incompressible limit, the energy norm error of ME-FEM solution is expected to be close to the theoretical asymptotic rate of O(h). Accordingly, the pressure is calculated using the following formula:

$$p=^h=\lambda \nabla \cdot u^h \quad (58)$$

which remains finite in the incompressible limit, and the $L_2$—norm error estimate holds $$\|\nabla \cdot (u-u^h)\|_{0,\Omega} \leq c_2 h |\nabla \cdot u|_{1,\Omega} \quad (59)$$

Although the ME-FEM element does not contain any spurious zero-energy mode, the ME-FEM formulation using conventional Gaussian quadrature rule experiences pressure oscillation in the near-incompressible analysis for certain cases. The cause of pressure oscillation in ME-FEM formulation using Gaussian quadrature rule is different from the one in the discontinuous-pressure/displacement mixed finite element method which exhibits a rank-deficiency in the assembled pressure equations.

The pressure oscillation in ME-FEM method is due to the nature of the weighted residual-based Galerkin method using a low-order approximation. Further, the displacement derivatives in ME-FEM method are discontinuous across element boundaries. A strain smoothing procedure is employed to remove such oscillation. Several post-processing pressure smoothing techniques can be applied to produce a smooth pressure distribution. However additional computational effort is required and robust performance in the non-linear analysis may not be guaranteed.

To suppress the possible pressure oscillation, an area-weighted integration incorporated with the divergence-free ME-FEM interpolation is developed to provide the smoothing effects for strains and pressure as well as divergence-free property.

Area-Weighted Integration

An area-weighted integration based on the strain smoothing concept is introduced to the ME-FEM element 204 to provide the smoothing effect on strains and to suppress the pressure oscillation in the near-incompressible analysis. Additionally, the area-weighted integration provides divergence-free ME-FEM interpolation in triangular and tetrahedral elements. The strain smoothing is defined as follows:

$$\tilde{\varepsilon}^h = \tilde{\nabla} u^h = \frac{1}{A_m} \int_{\Omega_m} \nabla u^h d\Omega \tag{60}$$

where $\tilde{\nabla}$ denotes the smoothed gradient operator. $A_m$ 601 is the area of the smoothed domain $\Omega_m$ 602. Each element 604 contains four smoothed domains 602 and each smoothed domain 602 has strain contribution from two Gauss points 610 (shown as triangles) shown in FIG. 6A. Accordingly the smoothed strain in the first smoothed domain 602 is expressed by $$\tilde{\varepsilon}^h = \frac{1}{2A_m} (\varepsilon(\xi_{g1}, \eta_{g1}) \det(J_1) + \varepsilon(\xi_{g2}, \eta_{g2}) \det(J_2)) \tag{61}$$

$$A_m = \frac{\det(J_1) + \det(J_2)}{2} = \frac{\det(G_F G_x^T)_1 + \det(G_F G_x^T)_2}{2} \tag{62}$$

This leads to the smoothed divergence $\tilde{\nabla} \cdot u^h$ in one-element model given by $$\begin{aligned}
\tilde{\nabla} \cdot u^h &= tr(\tilde{\varepsilon}^h) \\
&= tr\left(\frac{1}{A_m} \int_{\Omega_m} \nabla u^h d\Omega\right) \\
&= \frac{1}{A_m} \int_{\Omega_m} tr(\nabla u^h) d\Omega \\
&= \frac{1}{A_m} \int_{\Omega_m} \nabla \cdot u^h d\Omega \\
&= \frac{\nabla \cdot u^h(\xi_{g1}) \det(J_1) + \nabla \cdot u^h(\xi_{g2}) \det(J_2)}{\det(J_1) + \det(J_2)} \\
&= 0
\end{aligned} \tag{63}$$

which verifies the divergence-free condition of Eq. (49) in the incompressible limit.

Figure 6A:
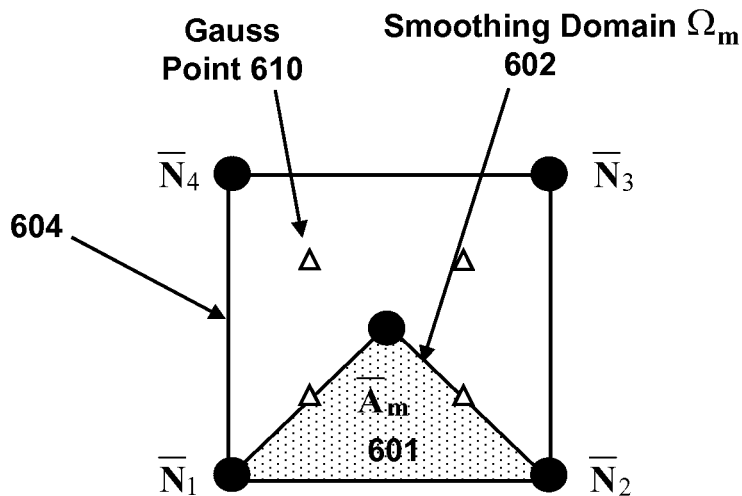
FIGS. 6A and 6B are diagrams showing exemplary area-weighted integration procedures used in an embodiment of the present invention.
Figure 6B:
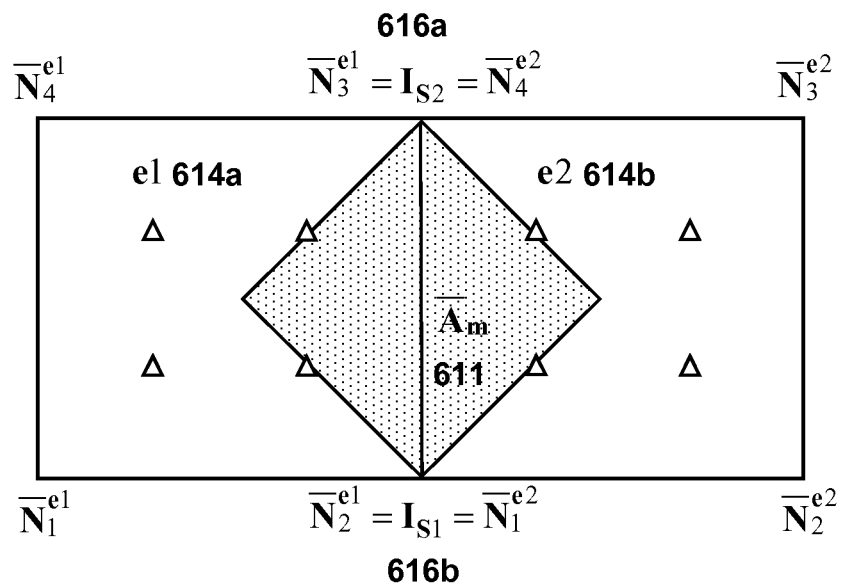

For adjacent elements 614*a-b* shown in FIG. 6B, the smoothing area $A_m$ 611 is calculated from the sum of four Jacobian determinants in two elements 614*a-b* given by $$A_m = \frac{\det(J_2^{e1}) + \det(J_3^{e1}) + \det(J_1^{e2}) + \det(J_4^{e2})}{2} \tag{64}$$

$$= \frac{\det(G_F G_x^T)_2^{e1} + \det(G_F G_x^T)_3^{e1} +}{2}$$
$$+ \frac{\det(G_F G_x^T)_1^{e2} + \det(G_F G_x^T)_4^{e2}}{2}$$

where superscripts $e_{e1}$ and $e_2$ are adjacent elements 614*a-b* that share the same element edge m and two connecting nodes $I_{s1}$ and $I_{s2}$ 616*a-b*. Similar to the derivation in Eq. (63), it is proved that the smoothed divergence $\tilde{\nabla} \cdot u^h$ in the adjacent elements 614*a-b* satisfies the divergence-free condition in the incompressible limit. With Eq. (64), the weighted average of the strain-displacement matrix in the smoothed domain $\Omega_m$ is given by $$\tilde{B}_I = \begin{bmatrix} \tilde{b}_{Ix} & 0 \\ 0 & \tilde{b}_{Iy} \\ \tilde{b}_{Iy} & \tilde{b}_{Ix} \end{bmatrix} \tag{65}$$

$$\tilde{b}_{Ix} = \frac{(b_{Ix})_2^{e1} \det(J_2^{e1}) + (b_{Ix})_3^{e1} \det(J_3^{e1}) +}{2A_m} + \frac{(b_{Ix})_1^{e2} \det(J_1^{e2}) + (b_{Ix})_4^{e2} \det(J_4^{e2})}{2A_m} \tag{66}$$

$$\tilde{b}_{Iy} = \frac{(b_{Iy})_2^{e1} \det(J_2^{e1}) + (b_{Iy})_3^{e1} \det(J_3^{e1}) +}{2A_m} + \frac{(b_{Iy})_1^{e2} \det(J_1^{e2}) + (b_{yx})_4^{e2} \det(J_4^{e2})}{2A_m} \tag{67}$$

where the components in $\tilde{b}_{Ix}$ and $\tilde{b}_{Iy}$ are expressed by $$\begin{Bmatrix} (b_{Ix})_i^{e1} \\ (b_{Ix})_i^{e1} \end{Bmatrix} = J_i^{e1-1} \begin{Bmatrix} \frac{\partial \Psi_I^{e1}(\xi_{gi}, \eta_{gi})}{\partial \xi} \\ \frac{\partial \Psi_I^{e1}(\xi_{gi}, \eta_{gi})}{\partial \eta} \end{Bmatrix}, i = 2 \text{ and } 3 \tag{68}$$

$$\begin{Bmatrix} (b_{Ix})_i^{e2} \\ (b_{Ix})_i^{e2} \end{Bmatrix} = J_i^{e2-1} \begin{Bmatrix} \frac{\partial \Psi_I^{e2}(\xi_{gi}, \eta_{gi})}{\partial \xi} \\ \frac{\partial \Psi_I^{e2}(\xi_{gi}, \eta_{gi})}{\partial \eta} \end{Bmatrix}, i = 1 \text{ and } 4 \tag{69}$$

It is easy to verify that for multiple elements nl as shown in FIG. 4, the smoothed gradient matrix of inter node I satisfies the integration constraint, i.e.

$$\int_\Omega \tilde{b}_I d\Omega = \tag{70}$$

$$\sum_{n=1}^{nl} \int_{-1}^{1} \int_{-1}^{1} \tilde{b}_I^n \det(J_\xi^n) d\xi d\eta = \sum_{n=1}^{nl} \int_{-1}^{1} \int_{-1}^{1} b_I^n \det(J_\xi^n) d\xi d\eta = 0$$

Therefore the area-weighted integration preserves the linear exactness and the resultant ME-FEM formulation is valid in the compressible case, for example, passing the patch test (one of the fundamental requirements in finite element analysis).

Modified Hu-Washizu Formulation

To introduce the strain smoothing formulation into the Galerkin approximation, a weak form of the Hu-Washizu variational principle is considered and given by $$\delta U_{HW}(u, \tilde{\epsilon}, \tilde{\sigma}) = \int_\Omega \delta \tilde{\epsilon}^T C \tilde{\epsilon} d\Omega + \int_\Omega \delta \tilde{\sigma} (\nabla u - \tilde{\epsilon}) d\Omega - \delta W_{ext} \tag{71}$$

where u is the displacement field, $\tilde{\epsilon}$ is the assume strain field and iii is the stress field evaluated from the constitutive equation in Eq. (3) using the assumed strain field. The term $\delta W_{ext}$ designates the external virtual work by the body force f and traction t on the natural boundary $\Gamma_N$.

The assumed strain method is adopted to eliminate the second term on the RHS of Eq. (71) by assuming that stress field $\tilde{\sigma}$ is orthogonal to the difference between the displacement gradient $\nabla u$ and smoothed strain filed $\tilde{\epsilon}$. Using Eq. (60), one can find that $$\int_\Omega \delta\tilde{\sigma}(\nabla u - \tilde{\varepsilon})d\Omega = \sum_{m=1}^{nm}\delta\tilde{\sigma}\int_{\Omega_m}(\nabla u - \tilde{\varepsilon})d\Omega = 0 \quad (72)$$

which exactly satisfies the orthogonal condition. The index nm in Eq. (72) denotes the total number of smoothed domain $\Omega_m$ in $\Omega$ ($\Omega = \cup_m \Omega_m$).

After eliminating the stress components from Eq. (71) using Eq. (72), the following weak form of the modified Hu-Washizu functional is obtained depending only on strain and displacement fields:

$$\delta U_{HWmod}(u,\tilde{\varepsilon}) = \int_\Omega \delta\tilde{\varepsilon}^T C \tilde{\varepsilon} d\Omega - \delta W_{ext} \quad (73)$$

The displacements in each element are approximated by the ME-FEM interpolation and are expressed by $$u^h = \sum_{I=1}^{5} \Psi_I u_I \quad (74)$$

The strains are approximated and given by $$\tilde{\varepsilon}^h = \sum_{I=1}^{NP} \tilde{B}_I u_I \quad (75)$$

where $\tilde{B}$ is the smoothed gradient matrix defined in Eq. (65) and $5 \leq NP \leq 8$ is the number of nodes involved in each smoothed domain $\Omega_m$. By introducing the displacement and strain approximations into Eq. (73), the following discrete governing equation is obtained:

$$\tilde{K}d = f^{ext} \quad (76)$$

$$\tilde{K}_{IJ} = \int_\Omega \tilde{B}_I^T C \tilde{B}_J d\Omega \quad (77)$$

$$f^{ext} = \int_\Omega \Psi^T f d\Omega + \int_{\Gamma_N} \Psi^T t d\Gamma \quad (78)$$

Since ME-FEM element interpolation preserves Kronecker-delta property at the element boundary, essential boundary conditions can be applied in a normal manner (e.g., finite element analysis).

When the eigenvalue analysis for a single element is reanalyzed using ME-FEM method including strain smoothing, almost identical locking-free modes shown in FIG. 5B are obtained.

Figure 7:
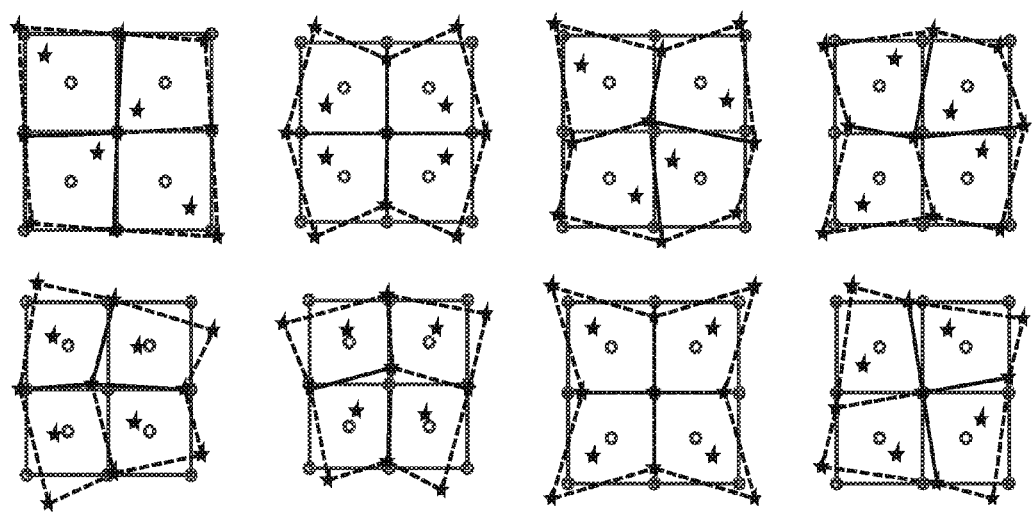
FIG. 7 is a diagram showing eight locking-free modes in four ME-FEM elements including area-weighted integration.

Similarly, for multiple elements the results are presented in FIG. 7. Comparing to the EFG results in FIG. 1B, eight eigenvalues of ME-FEM elements with strain smoothing are bounded in the near-incompressible limit and the corresponding deformation modes are non-locking Symmetry Properties of Shape Function Derivatives The symmetry properties of the shape function derivatives in the five-noded ME-FEM element are expressed by $$\Psi_{1,\xi}(\xi_{g1},\eta_{g1}) = -\Psi_{2,\xi}(\xi_{g2},\eta_{g2}) = -\Psi_{3,\xi}(\xi_{g3},\eta_{g3}) = \Psi_{4,\xi}(\xi_{g4},\eta_{g4})$$

$$\Psi_{1,\eta}(\xi_{g1},\eta_{g1}) = \Psi_{2,\eta}(\xi_{g2},\eta_{g2}) = -\Psi_{3,\eta}(\xi_{g3},\eta_{g3}) = -\Psi_{4,\eta}(\xi_{g4},\eta_{g4})$$

$$\Psi_{2,\xi}(\xi_{g1},\eta_{g1}) = -\Psi_{1,\xi}(\xi_{g2},\eta_{g2}) = -\Psi_{4,\xi}(\xi_{g3},\eta_{g3}) = \Psi_{3,\xi}(\xi_{g4},\eta_{g4})$$

$$\Psi_{4,\eta}(\xi_{g1},\eta_{g1}) = \Psi_{3,\eta}(\xi_{g2},\eta_{g2}) = -\Psi_{2,\eta}(\xi_{g3},\eta_{g3}) = -\Psi_{1,\eta}(\xi_{g4},\eta_{g4})$$

$$\Psi_{2,\eta}(\xi_{g1},\eta_{g1}) = \Psi_{1,\eta}(\xi_{g2},\eta_{g2}) = -\Psi_{4,\eta}(\xi_{g3},\eta_{g3}) = -\Psi_{3,\eta}(\xi_{g4},\eta_{g4})$$

$$\Psi_{4,\xi}(\xi_{g1},\eta_{g1}) = -\Psi_{3,\xi}(\xi_{g2},\eta_{g2}) = -\Psi_{2,\xi}(\xi_{g3},\eta_{g3}) = \Psi_{1,\xi}(\xi_{g4},\eta_{g4})$$

$$\Psi_{3,\xi}(\xi_{g1},\eta_{g1}) = -\Psi_{4,\xi}(\xi_{g2},\eta_{g2}) = -\Psi_{1,\xi}(\xi_{g3},\eta_{g3}) = \Psi_{2,\xi}(\xi_{g4},\eta_{g4})$$

$$\Psi_{3,\eta}(\xi_{g1},\eta_{g1}) = \Psi_{4,\eta}(\xi_{g2},\eta_{g2}) = -\Psi_{1,\eta}(\xi_{g3},\eta_{g3}) = -\Psi_{2,\eta}(\xi_{g4},\eta_{g4})$$

$$\Psi_{5,\xi}(\xi_{g1},\eta_{g1}) = -\Psi_{5,\xi}(\xi_{g2},\eta_{g2}) = -\Psi_{5,\xi}(\xi_{g3},\eta_{g3}) = \Psi_{5,\xi}(\xi_{g4},\eta_{g4})$$

$$\Psi_{5,\eta}(\xi_{g1},\eta_{g1}) = \Psi_{5,\eta}(\xi_{g2},\eta_{g2}) = -\Psi_{5,\eta}(\xi_{g3},\eta_{g3}) = -\Psi_{5,\eta}(\xi_{g4},\eta_{g4})$$

$$\Psi_{1,\xi}(\xi_{g1},\eta_{g1}) = \Psi_{1,\eta}(\xi_{g1},\eta_{g1})$$

$$\Psi_{2,\xi}(\xi_{g1},\eta_{g1}) = \Psi_{4,\eta}(\xi_{g1},\eta_{g1})$$

$$\Psi_{5,\xi}(\xi_{g1},\eta_{g1}) = \Psi_{5,\eta}(\xi_{g1},\eta_{g1})$$

where $\xi_{gi} = (\xi_{gi},\eta_{gi})$ i=1, 4 are Gauss points 610.

Figure 8:
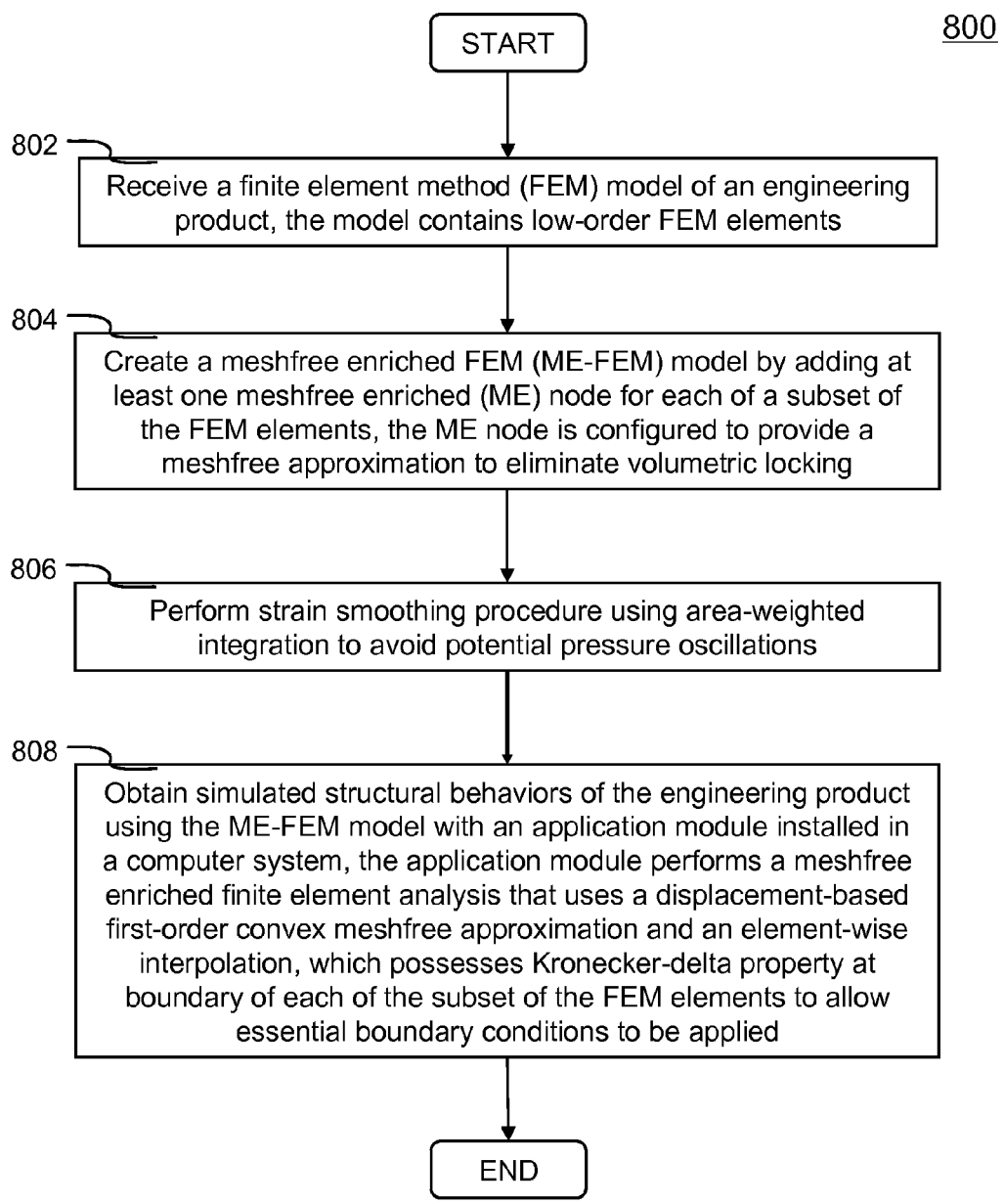
FIG. 8 is a flowchart illustrating an exemplary process of numerical simulation of structural behaviors in compressible or near-incompressible region using ME-FEM in accordance with one embodiment of the present invention.

Referring now to FIG. 8, it is shown a flowchart illustrating an exemplary process 800 for numerical simulation of structural behaviors in compressible or near-incompressible region using a meshfree-enriched finite element method in accordance with one embodiment of the present invention. Process 800 can be implemented in software or an application module executed in a computer system.

Process 800 starts, at step 802, receiving a FEM model of an engineering product (e.g., car, airplane, or components). The FEM model contains low-order FEM elements, for example, bilinear quadrilateral elements or triangular elements. These low-order elements contain only corner nodes without any mid-edge or middle node.

Next, at step 804, a meshfree enriched FEM (ME-FEM) model is created by adding at least one meshfree enriched (ME) node to each of a subset of the FEM elements. The ME node is configured to use generalized meshfree approximation to eliminate volumetric locking described in previous paragraphs. The subset can include the entire or just a portion of the FEM model. In other words, a mixed mode of ME-FEM and FEM elements may be used for the simulation.

Process 800 then performs a strain smoothing procedure using area-weighted integration technique to avoid potential pressure oscillation problem (a numerical problem) at step 806. Applying such technique is to ensure the simulation results are more realistic without using postprocessing averaging technique.

Finally, at step 808, after the ME-FEM model has been created, numerically simulated structural behaviors of the engineering product are obtained. This is achieved by using the ME-FEM model with an application module installed in a computer system. The application module is configured for performing a meshfree enriched finite element analysis that uses a displacement-based first-order convex meshfree approximation and an element-wise interpolation, The interpolation possesses Kronecker-delta property at boundary of each ME-FEM element to allow essential boundary conditions to be applied. The displacement-based first-order convex meshfree approximation is configured to eliminate volumetric locking. The numerically simulated structural behaviors can be used for assisting user (e.g., scientist, engineer, etc.) to improve the engineering product.

Figure 9:
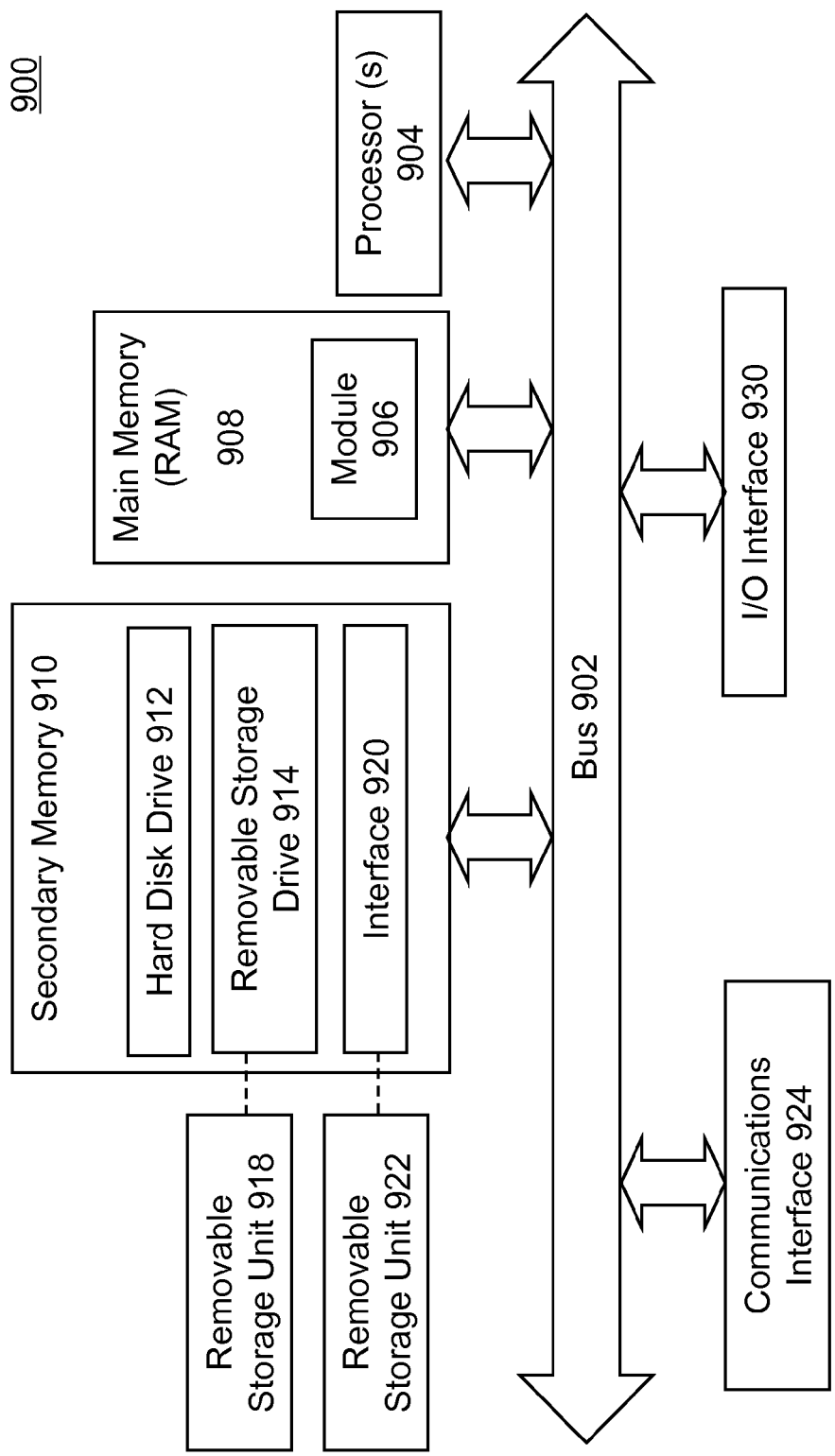
FIG. 9 is a function diagram showing salient components of an exemplary computer system, in which an embodiment of the present invention may be implemented.

According to one aspect, the present invention is directed towards one or more computer systems capable of carrying out the functionality described herein. An example of a computer system 900 is shown in FIG. 9. The computer system 900 includes one or more processors, such as processor 904. The processor 904 is connected to a computer system internal communication bus 902. Various software embodiments are described in terms of this exemplary computer system. After reading this description, it will become apparent to a person skilled in the relevant art(s) how to implement the invention using other computer systems and/or computer architectures.

Computer system 900 also includes a main memory 908, preferably random access memory (RAM), and may also include a secondary memory 910. The secondary memory 910 may include, for example, one or more hard disk drives 912 and/or one or more removable storage drives 914, representing a floppy disk drive, a magnetic tape drive, an optical disk drive, etc. The removable storage drive 914 reads from and/or writes to a removable storage unit 918 in a well-known manner. Removable storage unit 918, represents a floppy disk, magnetic tape, optical disk, etc. which is read by and written to by removable storage drive 914. As will be appreciated, the removable storage unit 918 includes a computer readable storage medium having stored therein computer software and/or data.

In alternative embodiments, secondary memory 910 may include other similar means for allowing computer programs or other instructions to be loaded into computer system 900. Such means may include, for example, a removable storage unit 922 and an interface 920. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 922 and interfaces 920 which allow software and data to be transferred from the removable storage unit 922 to computer system 900. In general, Computer system 900 is controlled and coordinated by operating system (OS) software, which performs tasks such as process scheduling, memory management, networking and I/O services.

There may also be a communications interface 924 connecting to the bus 902. Communications interface 924 allows software and data to be transferred between computer system 900 and external devices. Examples of communications interface 924 may include a modem, a network interface (such as an Ethernet card), a communications port, a Personal Computer Memory Card International Association (PCMCIA) slot and card, etc. The computer 900 communicates with other computing devices over a data network based on a special set of rules (i.e., a protocol). One of the common protocols is TCP/IP (Transmission Control Protocol/Internet Protocol) commonly used in the Internet. In general, the communication interface 924 manages the assembling of a data file into smaller packets that are transmitted over the data network or reassembles received packets into the original data file. In addition, the communication interface 924 handles the address part of each packet so that it gets to the right destination or intercepts packets destined for the computer 900. In this document, the terms "computer program medium" and "computer readable medium" are used to generally refer to media such as removable storage drive 914, and/or a hard disk installed in hard disk drive 912. These computer program products are means for providing software to computer system 900. The invention is directed to such computer program products.

The computer system 900 may also include an input/output (I/O) interface 930, which provides the computer system 900 to access monitor, keyboard, mouse, printer, scanner, plotter, and alike.

Computer programs (also called computer control logic) are stored as application modules 906 in main memory 908 and/or secondary memory 910. Computer programs may also be received via communications interface 924. Such computer programs, when executed, enable the computer system 900 to perform the features of the present invention as discussed herein. In particular, the computer programs, when executed, enable the processor 904 to perform features of the present invention. Accordingly, such computer programs represent controllers of the computer system 900.

In an embodiment where the invention is implemented using software, the software may be stored in a computer program product and loaded into computer system 900 using removable storage drive 914, hard drive 912, or communications interface 924. The application module 906, when executed by the processor 904, causes the processor 904 to perform the functions of the invention as described herein.

The main memory 908 may be loaded with one or more application modules 906 that can be executed by one or more processors 904 with or without a user input through the I/O interface 930 to achieve desired tasks. In operation, when at least one processor 904 executes one of the application modules 906, the results are computed and stored in the secondary memory 910 (i.e., hard disk drive 912). The status of the meshfree enriched finite element analysis is reported to the user via the I/O interface 930 either in a text or in a graphical representation to a monitor coupling to the computer system 900.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a five-noded quadrilateral element (i.e., an element having four (4) corner nodes plus one (1) meshfree enriched node) has been shown and described to explain how ME-FEM works mathematically. Other types of ME-FEM element can be used for achieving substantially similar objectives of the present invention, for example, six-noded quadrilateral element (i.e., element having four (4) corner nodes plus two (2) ME nodes), or a four-noded triangular element. Additionally, whereas two-dimensional element (quadrilateral element) has been shown and described to demonstrate how the present invention works, the present invention can be implemented on a three dimensional element (e.g., tetrahedral element shown in FIG. 2D). ME-FEM for triangular and tetrahedral elements are substantially similar to that of quadrilateral elements. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A computer-implemented method of simulating structural behaviors of an engineering product, the method comprising:

receiving, by an application module installed in a computer system, a finite element method (FEM) model representing an engineering product, said FEM model comprises a plurality of FEM elements;

creating, by said application module, a meshfree enriched FEM (ME-FEM) model by adding at least one meshfree enriched (ME) node into each of a subset of the FEM elements, said at least one ME node is configured to eliminate volumetric locking; and obtaining, by said application module, numerically-simulated structural behaviors of the engineering product using the ME-FEM model, wherein said application module is configured to perform a meshfree enriched finite element analysis that employs a displacement-based first-order convex meshfree approximation and an element-wise interpolation possessing Kronecker-delta property at said each of said subset of the FEM element's boundary allowing essential boundary conditions to be applied.

2. The computer-implemented method of claim 1, wherein the FEM elements comprise low-order finite elements being defined by corner nodes and edges, said edges are defined by connecting a pair of adjacent said corner nodes.

3. The computer-implemented method of claim 1, wherein said displacement-based first-order convex meshfree approximation uses a basis function derived from one of an exponential, a hyperbolic tangent, an inverse tangent and Renyi function.

4. The computer-implemented method of claim 1, wherein said at least one ME node is located within corresponding domain of said each of said subset of the FEM elements.

5. The computer-implemented method of claim 1, wherein said each of said subset of the FEM elements is mapped to a transformed space to enable applying one or more domains of influence for the at least one ME node.

6. The computer-implemented method of claim 5, wherein the transformed space is a parametric space corresponding to one of said domains of influence.

7. The computer-implemented method of claim 1, wherein said structural behaviors comprises pressures and strains.

8. The computer-implemented method of claim 7, wherein said ME-FEM further uses an area-weighted integration incorporated with the element-wise interpolation to smoothen said pressures and said strains.

9. The computer-implemented method of claim 8, wherein the smoothed strains are added into meshfree formulation using a modified Hu-Washizu variation principle.

10. The computer-implemented method of claim 8, wherein said element-wise interpolation has a discrete divergence-free property.

11. A non-transitory computer-readable storage medium containing instructions for controlling a computer system to perform a simulation of structural behaviors of an engineering product by a method comprising:

receiving, by an application module installed in a computer system, a finite element method (FEM) model representing an engineering product, said FEM model comprises a plurality of FEM elements;

creating, by said application module, a meshfree enriched FEM (ME-FEM) model by adding at least one meshfree enriched (ME) node into each of a subset of the FEM elements, said at least one ME node is configured to eliminate volumetric locking; and obtaining, by said application module, numerically-simulated structural behaviors of the engineering product using the ME-FEM model, wherein said application module is configured to perform a meshfree enriched finite element analysis that employs a displacement-based first-order convex meshfree approximation and an element-wise interpolation possessing Kronecker-delta property at said each of said subset of the FEM element's boundary allowing essential boundary conditions to be applied.

12. A system for simulating structural behaviors of an engineering product, the system comprising:

a main memory for storing computer readable code for an application module;

a plurality of processing units coupled to the main memory, said processing units executing the computer readable code in the main memory to cause the application module to perform operations by a method of:

receiving a finite element method (FEM) model representing an engineering product, said FEM model comprises a plurality of FEM elements;

creating a meshfree enriched FEM (ME-FEM) model by adding at least one meshfree enriched (ME) node into each of a subset of the FEM elements, said at least one ME node is configured to eliminate volumetric locking; and obtaining numerically-simulated structural behaviors of the engineering product using the ME-FEM model, wherein said application module is configured to perform a meshfree enriched finite element analysis that employs a displacement-based first-order convex meshfree approximation and an element-wise interpolation possessing Kronecker-delta property at said each of said subset of the FEM element's boundary allowing essential boundary conditions to be applied.

* * * * *